(12) United States Patent
Yu et al.

(10) Patent No.: US 6,680,233 B2
(45) Date of Patent: Jan. 20, 2004

(54) SEMICONDUCTOR DEVICE FORMED WITH DISPOSABLE SPACER AND LINER USING HIGH-K MATERIAL AND METHOD OF FABRICATION

(75) Inventors: Bin Yu, Cupertino, CA (US); Qi Xiang, San Jose, CA (US); HaiHong Wang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 164 days.

(21) Appl. No.: 09/974,167

(22) Filed: Oct. 9, 2001

(65) Prior Publication Data

US 2003/0071290 A1 Apr. 17, 2003

(51) Int. Cl.$^7$ ................. H01L 21/336; H01L 21/31
(52) U.S. Cl. ................. 438/303; 438/163; 438/301; 438/514; 438/785; 438/791
(58) Field of Search ................. 438/785, 216, 438/287, 595, 163, 301, 303, 306, 763, 791

(56) References Cited

U.S. PATENT DOCUMENTS

| | | | |
|---|---|---|---|
| 4,559,091 A | * 12/1985 | Allen et al. | ............... 117/8 |
| 6,013,553 A | 1/2000 | Wallace et al. | |
| 6,020,024 A | 2/2000 | Maiti et al. | |
| 6,107,130 A | * 8/2000 | Fulford et al. | ....... 257/E29.266 |
| 6,207,485 B1 | 3/2001 | Gardner et al. | |
| 6,277,738 B1 | * 8/2001 | Choi et al. | ............... 438/256 |
| 6,303,452 B1 | * 10/2001 | Chen et al. | ............... 438/305 |

\* cited by examiner

*Primary Examiner*—Carl Whitehead, Jr.
*Assistant Examiner*—David L. Hogans
(74) *Attorney, Agent, or Firm*—Renner, Otto, Boisselle & Sklar, LLP

(57) ABSTRACT

A semiconductor device and method of manufacture. A liner composed of a high-K material having a relative permittivity of greater than 10 is formed adjacent at least the sidewalls of a gate. Sidewall spacers are formed adjacent the gate and spaced apart from the gate by the liner. The liner can be removed using an etch process that has substantially no reaction with a gate dielectric of the gate.

7 Claims, 2 Drawing Sheets

SEMICONDUCTOR DEVICE FORMED WITH DISPOSABLE SPACER AND LINER USING HIGH-K MATERIAL AND METHOD OF FABRICATION

TECHNICAL FIELD

The present invention relates generally to the semiconductor devices and the fabrication thereof and, more particularly, to a semiconductor device fabricated with the use of a disposable high-K material layer.

BACKGROUND

Fabrication of semiconductor devices, such as metal oxide semiconductor field effect transistors (MOSFET) and complementary metal oxide semiconductor (CMOS) integrated circuits, involves numerous processing steps. Each step may potentially have an adverse effect on one or more device components.

In a typical MOSFET, a source and a drain are formed in an active region of a semiconductor layer by implanting N-type or P-type impurities in a layer of semiconductor material. Disposed between the source and drain is a body region. Disposed above the body region is a gate electrode. The gate electrode and the body are spaced apart by a gate dielectric layer. It is noted that MOSFETs can be formed in bulk format (for example, the active region being formed in a silicon substrate) or in a semiconductor-on-insulator (SOI) format (for example, in a silicon film that is disposed on a insulating layer that is, in turn, disposed on a silicon substrate).

A pervasive trend in modern integrated circuit manufacture is to produce transistors, and the structural features thereof, that are as small as possible. Although the fabrication of smaller transistors allows more transistors to be placed on a single monolithic substrate for the formation of relatively large circuit systems in a relatively small die area, slight imperfections in the formation of the component parts of a transistor can lead to poor transistor performance and failure of the overall circuit. As an example, during the fabrication process, certain unwanted portions of various device layers are removed using wet and/or dry chemical etching techniques. During the etching process desired portions of the layer being etched are protected by a disposable mask layer or a previously patterned device component formed from a material that has very little reaction with the etchant. Occasionally, the desired portion of the layer being etched is partially etched forming an undercut below the edges of the protective layer. Such an undercut can lead to a reduction in the operational performance of the device being fabricated. As an example, in some device fabrication processes, the gate dielectric can become undercut by the removal of a disposable spacer or liner.

Accordingly, there exists a need in the art for semiconductor devices, such as MOSFETs, that are formed using techniques intended to minimize imperfections in the resulting device.

SUMMARY OF THE INVENTION

According to one aspect of the invention, a method of fabricating a semiconductor device is provided. The method includes the steps of providing a layer of semiconductor material; forming a gate including a gate dielectric and a gate electrode on the layer of semiconductor material, the gate electrode spaced from the layer of semiconductor material by the gate dielectric and the gate defining sidewalls; forming a liner from a material having a relative permittivity of greater than about 8, the liner formed adjacent at least the sidewalls of the gate; forming sidewall spacers adjacent the gate and spaced apart from the gate by the liner; implanting dopant species to form deep doped regions of a source and a drain in the layer of semiconductor material; removing the spacers; and removing the liner using an etch process that has substantially no reaction with the gate dielectric.

According to another aspect of the invention, a semiconductor device is provided. The semiconductor device includes a layer of semiconductor material; a gate disposed on the layer of semiconductor material, the gate including a gate dielectric and a gate electrode, the gate electrode spaced from the layer of semiconductor material by the gate dielectric and the gate defining sidewalls; and a disposable liner composed of a material having a relative permittivity of greater than about 8, the liner disposed adjacent at least the sidewalls of the gate, wherein the liner is removable by an etch process that has substantially no reaction with the gate dielectric.

According to yet another aspect of the invention, the invention is a semiconductor device. The semiconductor device includes a layer of semiconductor material; a gate disposed on the layer of semiconductor material, the gate including a gate dielectric and a gate electrode, the gate electrode spaced from the layer of semiconductor material by the gate dielectric and the gate defining sidewalls; a liner disposed adjacent at least the sidewalls of the gate; and disposable sidewall spacers composed of a material having a relative permittivity of greater than about 8, the spacers disposed adjacent the gate and spaced apart from the gate by the liner, wherein the spacers are removable by an etch process that has substantially no reaction with the liner.

BRIEF DESCRIPTION OF DRAWINGS

These and further features of the present invention will be apparent with reference to the following description and drawings, wherein.

DISCLOSURE OF INVENTION

Figure 1:
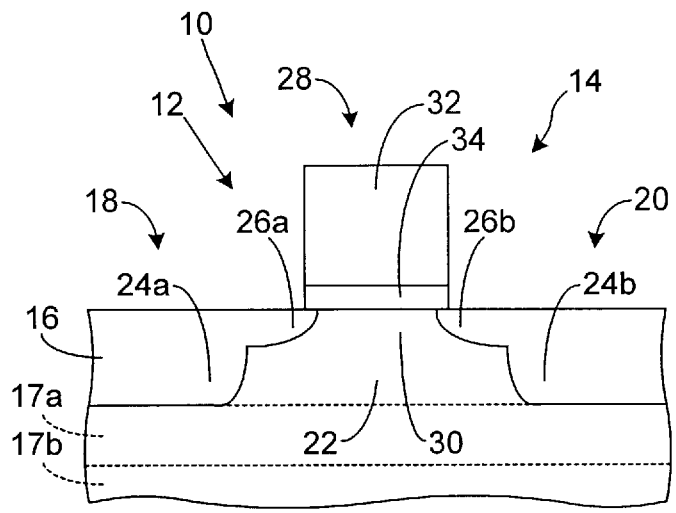
FIG. 1 is a schematic block diagram of a CMOS transistor formed in accordance with the present invention.

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Referring initially to FIG. 1, a semiconductor device 10 is illustrated. The illustrated semiconductor device 10 is a metal oxide semiconductor field effect transistor (MOSFET) for use in, for example, the construction of a complementary metal oxide semiconductor (CMOS) integrated circuit. As one skilled in the art will appreciate, the fabrication techniques described herein can be used for other types of semiconductor devices (e.g., other types of transistors, memory cells, etc.) and the illustration of a MOSFET is merely exemplary. However, the semiconductor device 10 will sometimes be referred to herein as a MOSFET 12.

The MOSFET 12 has an active region 14 formed in a layer of semiconductor material 16. The layer of semiconductor material 16 can be, for example, a silicon substrate for the formation of bulk type devices. Alternatively, the layer of semiconductor material 16 can be, for example, a silicon film formed on a layer of insulating material 17a (denoted by dashed lines in FIG. 1). The insulating layer 17a is, in turn, formed on a semiconductor substrate 17b so that the resultant devices are formed in semiconductor-on-insulator (SOI) format as is well known in the art.

The active region 14 includes a source 18, a drain 20 and a body 22 disposed between the source 18 and the drain 20. The source 18 and the drain 20 respectively include deep doped regions 24a, 24b and extensions 26a, 26b.

A gate 28 is disposed on the layer of semiconductor material 16 over the body 22 and defines a channel 30 within the body 22 and interposed between the source 18 and the drain 20. The gate 28 includes a gate electrode 32 spaced apart from the layer of semiconductor material 16 by a gate dielectric 34. As illustrated, the extensions 26a, 26b may laterally defuse under the gate 28 as is known in the art.

Figure 2:
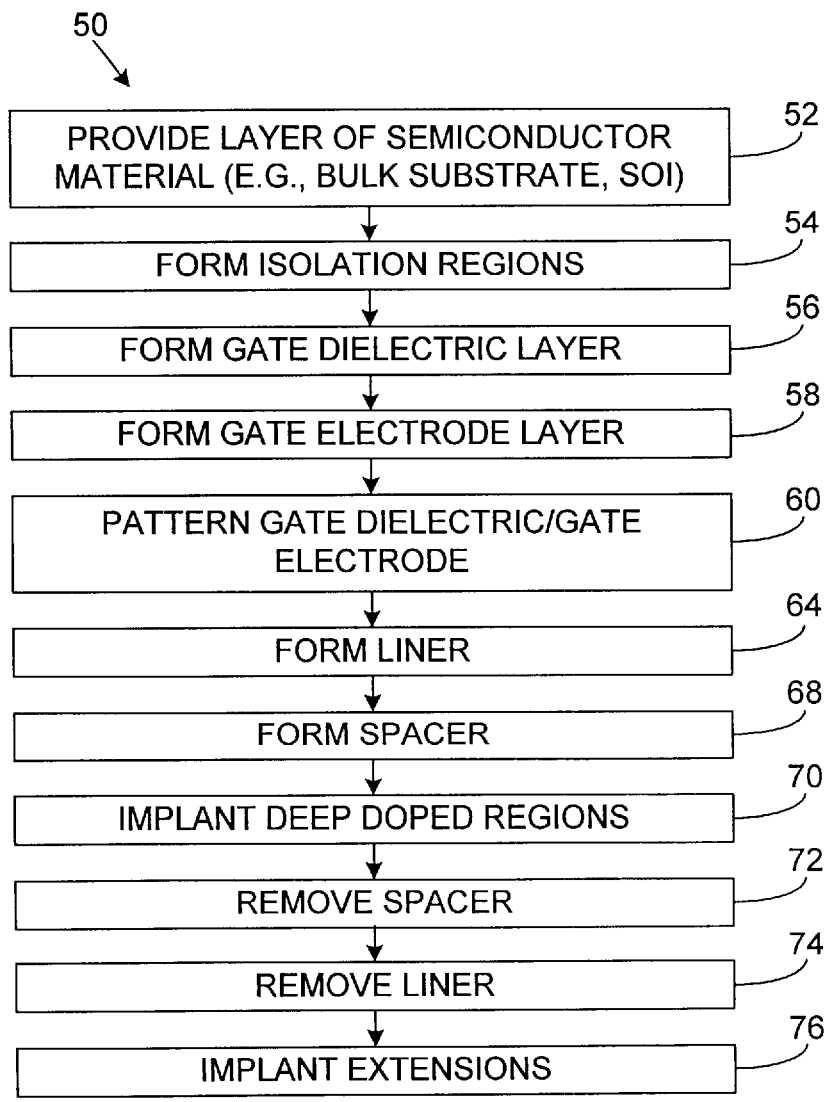
FIG. 2 is a flow chart illustrating a method of forming the CMOS transistor of FIG. 1.

Referring now to FIG. 2, a method 50 of forming the MOSFET 12 is illustrated. As will become apparent from the discussion below, the method 50 allows the formation of the MOSFET 12 where the gate dielectric 34 has substantially no undercut with respect to the gate electrode 32. This is accomplished by using a disposable high-K liner that has high etch selectivitiy with respect to the gate electrode 32.

Figure 3A:
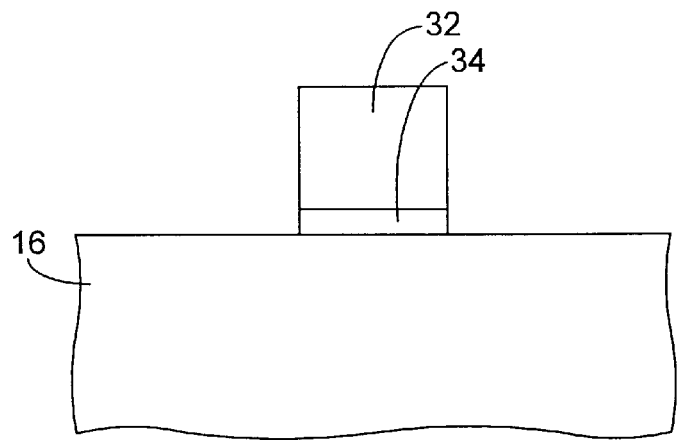
FIGS. 3A through 3C illustrate the CMOS transistor of FIG. 1 in various stages of manufacture.

With additional reference to FIG. 3A, the method 50 starts in step 52 where the layer of semiconductor material 16 is provided. As indicated above, the layer of semiconductor material can be a semiconductor substrate (such as a silicon substrate) for the formation of bulk type devices or a semiconductor film (such as a silicon film) formed as part of an SOI substrate stack. If desired, isolation regions (for example, shallow trench isolation, or STI, regions) can be formed in the layer of semiconductor material 16 to define the size and placement of multiple active regions 14 within the layer of semiconductor material 16. The isolation regions are formed in step 54 of method 50, but for simplicity of the drawing figures attached hereto the isolation regions are not shown.

Next, in step 56, a layer of material used to form the gate dielectric 34 is formed on the layer of semiconductor material 16. The gate dielectric 34 material is formed by growing or depositing a layer of gate dielectric material on top of the layer of semiconductor material 16. It is noted that the layer of material for the gate dielectric 14 will usually extend over at least the entire active region 14 and will be about 10 Å to about 50 Å thick. In the illustrated embodiment, the material used for the gate dielectric 14 is a "standard-K dielectric." A standard-K dielectric refers to a dielectric material having a relative permittivity, or K, of up to about 10. Relative permittivity is the ratio of the absolute permittivity ($\in$) found by measuring capacitance of the material to the permittivity of free space ($\in_o$), that is $K = \in / \in_o$. Example standard-K dielectric materials include, for example, silicon dioxide (K of about 3.9), silicon oxynitride (K of about 6 to 9 depending on the relative content of oxygen and nitrogen) and silicon nitride (K of about 6 to 9).

Next, in step 58, a layer of material used to form the gate electrode 32 is grown or deposited on the layer of material used to form the gate dielectric 34. The layer of material used to form the gate electrode 32 is about 500 Å to about 2,000 Å thick. The material used from the gate electrode 32 can be, for example, polysilicon, polysilicon-germanium, titanium nitride (e.g., TiN), tungsten (W) or tantalum nitride (e.g., TaN, $Ta_3N_5$).

After the layer of material used to form the gate dielectric 34 is grown or deposited in step 56 and the layer of material used to form the gate electrode 32 is grown or deposited in step 58, the gate 28, including the gate electrode 32 and the gate dielectric 34, are patterned in step 60. Techniques for patterning the gate 28 will be known to those skilled in the art and will not be described in detail herein. It is noted, however, that the layer of material used to form the gate dielectric 34 can be patterned separately from patterning of the layer of material used to form the gate electrode 32. In addition, patterning of the layer of material used to form the gate dielectric 34 can be conducted before formation of the layer of material used to form the gate electrode 32 in step 58. Alternatively, the layer of material used to form the gate dielectric 34 is not patterned or is patterned after implantation of ion species to dope the source 18 and the drain 20 as discussed below in more detail.

Figure 3B:
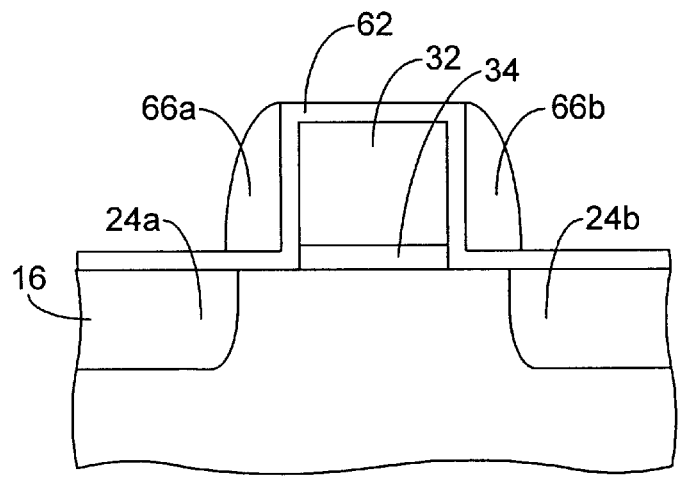

With additional reference to FIG. 3B, the method 50 continues in step 64 by forming a liner 62 over the exposed areas of the active region 14, along the sidewalls of the gate 28 and on top of the gate 28. In the illustrated embodiment, the liner 62 is a layer of material formed to be about 50 Å to about 150 Å thick.

The liner 62 is formed from a "high-K" material. As used herein, the term "high-K" refers to a material having a relative permittivity in one embodiment of about 10 or more and in another embodiment of about 20 or more. Exemplary high-K materials are identified below in Table 1. It is noted that Table 1 is not an exhaustive list of high-K materials. Other high-K materials include, for example, barium titanate ($BaTiO_3$), barium strontate ($BaSrO_3$), BST ($Ba_{1-x}Sr_xTiO_3$), barium strontium oxide ($Ba_{1-x}Sr_xO_3$), PST ($PbSc_xTa_{1-x}O_3$), and PZN ($PbZn_xNb_{1-x}O_3$). One skilled in the art will appreciate that other high-K materials may be available.

TABLE 1

| Dielectric Material | Approximate Relative Permittivity (K) |
| --- | --- |
| Alumina ($Al_2O_3$) | 9 |
| zirconium silicate | 12 |
| hafnium silicate | 15 |
| lanthanum oxide ($La_2O_3$) | 20–30 |
| hafnium oxide ($HfO_2$) | 40 |
| zirconium oxide ($ZrO_2$) | 25 |
| cesium oxide ($CeO_2$) | 26 |
| bismuth silicon oxide ($Bi_4Si_2O_{12}$) | 35–75 |
| titanium dioxide ($TiO_2$) | 30 |
| tantalum oxide ($Ta_2O_5$) | 26 |
| tungsten oxide ($WO_3$) | 42 |
| yttrium oxide ($Y_2O_3$) | 20 |

It is noted that the K-values for both standard-K and high-K materials may vary to some degree depending on the exact nature of the dielectric material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$, but may include variants of stoichiometric $Ta_2O_5$, which may be referred to as $Ta_xO_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry for all chemical names or formulas used herein are intended to fall within the scope of the present invention. For example, again using tantalum oxide, when the formula $Ta_2O_5$ is used, $Ta_xO_y$ is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

In step 68 and as illustrated in greater detail in FIG. 3B, the method 50 continues by forming spacers (also known in the art as sidewall spacers) 66a and 66b. More specifically, after the liner has been formed in step 64, spacers 66a and 66b are formed adjacent the portion of the liner 62 disposed along the sidewalls of the gate 28 and on top of the liner 62 extending laterally from the gate 28 for a desired distance (e.g., about 300 Å to about 1,000 Å). The spacers 66a and 66b are formed from a material such as a nitride (e.g., silicon nitride, or $Si_3N$). As will become more apparent below, the liner 62 and the spacers 66a, 66b are disposable.

The spacers 66a and 66b and the gate 28 act as a self-aligned mask for implantation of the deep doped regions 24a and 24b in step 70. Implanting dopant species to form the deep doped regions 24a and 24b of the source 18 and the drain 20, respectively, is well known in the art and will not be described in great detail herein. Briefly, to form a P-type deep doped region ions, such as boron, gallium or indium, can be implanted with an energy of about 5 KeV to 30 KeV and a dose of about $1 \times 10^{15}$ atoms/cm$^2$ to about $5 \times 10^{15}$ atoms/cm$^2$. N-type deep doped regions 24 can be formed by implanting ions, such as antimony, phosphorous or arsenic, at an energy of about 3 KeV to about 15 KeV and a dose of about $1 \times 10^{15}$ atoms/cm$^2$ to about $1 \times 10^{16}$ atoms/cm$^2$. Following implantation of the deep doped source and drain regions 24a and 24b, an anneal cycle is carried out to recrystallize the layer of semiconductor material 16 at a high temperature of, for example, about 950° C. to about 1,000° C. It is noted that the ions used to form the deep doped regions 24a, 24b are implanted through the liner 62 and may laterally diffuse slightly under the spacers 66a, 66b as is conventional.

Figure 3C:
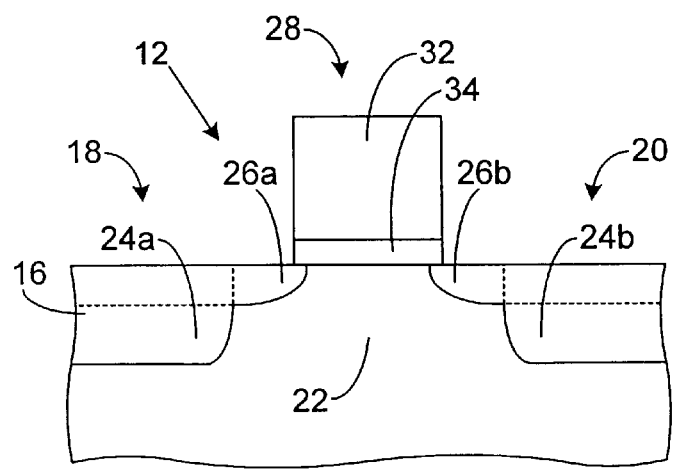

With additional reference to FIG. 3C, in step 72 the spacers 66a, 66b are removed by a wet chemistry etching process. For example, if the spacers made from silicon nitride then an $H_3PO_4$ acid etching process can be used as is known in the art. Once the spacers 66a and 66b are removed in step 72, the liner 62 is removed in step 74. The liner 62 is removed using a wet or dry etching process as is appropriate for the high-K material selected for the liner. Although any high-K material identified above can be used for formation of the liner 62, $HfO_2$, $ZrO_2$, $CeO_2$, $Al_2O_3$ and $TiO_2$ are well suited for use as the material for the liner 62.

It is noted that the etching processes used for removing high-K materials generally do not react with standard-K materials used for dielectric layers. Therefore, the etching process selected for the high-K material of the liner has etch selectivity that will generally not react with the material used to form the gate dielectric 34 (e.g., an oxide such as silicon oxide or silicon dioxide). Therefore, upon removing the liner 62, there will be no or very little removal of the gate dielectric 34 material. Accordingly, there will be substantially no undercut of the gate dielectric 34 under the gate electrode 32. As a result, the channel 30 will be well defined and operation of the MOSFET 12 will generally not be degraded by the undesired removal of a portion of the gate dielectric 34. As one skilled in the art will appreciate, if removal of a conventional liner (e.g., made from silicon-nitride or silicon-oxide) was desired, the etching process would often also attack, or react with, other components of the transistor, such as the gate dielectric.

Next, in step 76 the extensions 26a, 26b are implanted. The formation of shallow source 18 and drain 20 extensions, such as by using a lightly doped drain (LDD) technique, is well known in the art and will not be described in detail herein. Briefly, for a P-type extension region, ions such as boron, gallium or indium, can be implanted with an energy of about 1.0 Kev to about 3.0 KeV and a dose of about $1 \times 10^{14}$ atoms/cm$^2$ to about $1 \times 10^{15}$ atoms/cm$^2$. For an N-type extension region, ions such as antimony, phosphorous or arsenic, can be implanted at an energy of about 0.3 KeV to about 1.5 KeV and a dose of about $1 \times 10^{14}$ atoms/cm$^2$ to about $1 \times 10^{16}$ atoms/cm$^2$. Following dopant implantation, a thermal anneal cycle is carried out to recrystallize the layer of semiconductor material 16 at a temperature of about 600° C. to about 850° C. Alternatively, the extensions 26a, 26b can be formed using a solid phase epitaxy (SPE) process, especially when a lower temperature anneal cycle (e.g., about 600° C.) is desired. More specifically, SPE is used to amorphize the layer of semiconductor material 16 with an ion species, such as silicon, germanium, xenon, or the like. The energy and dosage of the ion species can be determined empirically for the device being fabricated. Next, dopant is implanted as described above to achieve the desired N-type or P-type doping and then the layer of semiconductor material 16 is recrystallized using a low temperature anneal (i.e., at a temperature of less than about 700° C.). As is known in the art, the extensions 26a, 26b may diffuse slightly under the gate 28 as is conventional.

In an alternative embodiment, the liner 62 and the spacers 66a, 66b are both formed from the same or different high-K materials. In yet another embodiment of the present invention, the liner 62 is made from a standard-K material such as silicon dioxide, and the spacers 66a, 66b and/or the gate dielectric 34 is made from one or more high-K materials. In this embodiment, the etch selectivity of the spacer 66 material will minimize damage to the liner 62 material during removal, thereby minimizing the possibility of damage to the semiconductor material layer 16. Damage to the source 18 and/or the drain 20 could result in a degradation of MOSFET 12 performance.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of fabricating a semiconductor device, comprising the steps of:

providing a layer of semiconductor material;

forming a gate including a gate dielectric and a gate electrode on the layer of semiconductor material, the gate electrode spaced from the layer of semiconductor material by the gate dielectric and the gate defining sidewalls;

forming a liner from a material having a relative permittivity of greater than about 8, the liner formed adjacent at least the sidewalls of the gate and including liner segments extending laterally from the gate over the layer of semiconductor material;

forming sidewall spacers adjacent the gate and spaced apart from the gate by the liner and separated from the layer of semiconductor material by the laterally extending liner segments;

implanting dopant species to form deep doped regions of a source and a drain in the layer of semiconductor material after spacer formation;

removing the spacers;

removing the liner using an etch process that has substantially no reaction with the gate dielectric, wherein the spacers and liner are removed after deep doped region implantation; and implanting dopant species to form extension regions of the source and the drain in the layer of semiconductor material after removal of the spacers and the liner.

2. The method according to claim 1, wherein the liner material is a high-K material having a relative permittivity of greater than about 10.

3. The method according to claim 1, wherein the implantation of dopant species to form the extension regions is part of a solid phase epitaxy (SPE) process.

4. The method according to claim 1, wherein the liner is about 50 Å to about 150 Å thick.

5. The method according to claim 1, wherein the liner is composed of one or more materials selected from $HfO_2$, $ZrO_2$, $CeO_2$, $Al_2O_3$, $TiO_2$ and mixtures thereof.

6. The method according to claim 1, wherein the gate dielectric is silicon dioxide.

7. The method according to claim 1, wherein the method results in the formation of a MOSFET having a spacerless and linerless gate.

* * * * *